(12) United States Patent
Sun et al.

(10) Patent No.: US 11,500,041 B2
(45) Date of Patent: Nov. 15, 2022

(54) HALL EFFECT SENSORS

(71) Applicant: GLOBALFOUNDRIES Singapore Pte. Ltd., Singapore (SG)

(72) Inventors: Yongshun Sun, Singapore (SG); Eng Huat Toh, Singapore (SG); Ping Zheng, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 108 days.

(21) Appl. No.: 17/063,099

(22) Filed: Oct. 5, 2020

(65) Prior Publication Data

US 2022/0107372 A1 Apr. 7, 2022

(51) Int. Cl.
*G01R 33/07* (2006.01)
*G01R 33/00* (2006.01)

(52) U.S. Cl.
CPC ......... *G01R 33/07* (2013.01); *G01R 33/0052* (2013.01); *G01R 33/0088* (2013.01)

(58) Field of Classification Search
CPC . G01R 33/07; G01R 33/0052; G01R 33/0088
See application file for complete search history.

(56) References Cited

U.S. PATENT DOCUMENTS

| | | | |
|---|---|---|---|
| 9,252,355 B2 | 2/2016 | Vanderhaegen et al. | |
| 2011/0209556 A1 | 9/2011 | Ausserlechner et al. | |
| 2012/0218018 A1* | 8/2012 | Petrie | G01R 33/075 327/187 |
| 2012/0286776 A1 | 11/2012 | Ausserlechner et al. | |
| 2013/0021026 A1* | 1/2013 | Ausserlechner | G01R 33/07 324/251 |
| 2013/0214775 A1* | 8/2013 | Ausserlechner | H01L 43/065 324/251 |
| 2015/0115950 A1 | 4/2015 | Cornils et al. | |
| 2016/0011281 A1* | 1/2016 | Sander | H01L 43/065 324/207.2 |
| 2018/0259598 A1* | 9/2018 | Iriguchi | H01L 43/065 |
| 2019/0025384 A1 | 1/2019 | Iriguchi | |

FOREIGN PATENT DOCUMENTS

| | | |
|---|---|---|
| DE | 102011004848 | 5/2012 |
| DE | 102013212463 | 1/2014 |

OTHER PUBLICATIONS

C. Sander, C. Leube and O. Paul, Novel Compact Two-Dimensional CMOS Vertical Hall Sensor (Year: 2015).*
Sander et al., "Novel compact two-dimensional CMOS vertical Hall sensor", IEEE, 2015, 4 pages.

(Continued)

*Primary Examiner* — Alvaro E Fortich
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to 3-contact hall sensors and methods of manufacture and modes of operation. The structure includes: a plurality of sensing blocks each of which include a plurality of contacts; a first switching element connecting to a first set of sensing blocks of the plurality of sensing blocks; and a second switching element connecting to a second set of sensing blocks of the plurality of sensing blocks.

16 Claims, 5 Drawing Sheets

(56) References Cited

OTHER PUBLICATIONS

Ausserlechner, "Hall Effect Devices with Three Terminals: Their Magnetic Sensitivity and Offset Cancellation Scheme", Journal of Sensors, 2016, 17 pages.
Sander et al., "Fully symmetric vertical hall devices in CMOS technology", IEEE, 2013, 4 pages.
German Office Action dated Jun. 15, 2022 in related Application No. 10 2021 122 586.8, 8 pages.
English Translation of the German Office Action dated Jun. 15, 2022 in related Application No. 10 2021 122 586.8, 2 pages.

* cited by examiner

HALL EFFECT SENSORS

FIELD OF THE INVENTION

The present disclosure relates to semiconductor structures and, more particularly, to Hall effect sensors, methods of manufacture and modes of operation.

BACKGROUND

A Hall effect sensor is used to measure a magnitude of a magnetic field. Its output voltage is directly proportional to the magnetic field strength passing through the sensor. The Hall effect sensor can be used for many different applications. These applications range from proximity sensing, positioning, speed detection, and current sensing applications. In fact, Hall effect sensors are commonly used to time a speed of wheels and shafts in the automotive industry. These include rotation of internal combustion engine ignition timing, tachometers, anti-lock braking systems and brushless DC motors.

A Hall effect sensor can be configured as four separate 3-contact vertical Hall (3C-Vhall) elements or 5-contact vertical (5C-Vhall) elements. The 3-contact vertical Hall (3C-Vhall) elements are commonly used to achieve better symmetry to improve offset/residual voltage; however, these 3-contact elements suffer from low sensitivity due to voltage drop in in bias supply elements resulting in lower effective voltage applied for sensing. The 5-contact vertical (5C-Vhall) element could eliminate the unwanted voltage drop, but the device is not symmetrical which results in large offset/residual voltage.

SUMMARY

In an aspect of the disclosure, a structure comprising: a plurality of sensing blocks each of which include a plurality of contacts; a first switching element coupled to a first set of sensing blocks of the plurality of sensing blocks; and a second switching element connecting to a second set of sensing blocks of the plurality of sensing blocks.

In an aspect of the disclosure, a structure comprising: a first plurality of sensing blocks each of which include a plurality of contacts; a second plurality of sensing blocks each of which include a plurality of contacts; and a fixed connection between the first plurality of sensing blocks and the second plurality of sensing blocks.

In an aspect of the disclosure, a method comprising: turning on a switch for a first sensing block and a third sensing block of a Hall effect sensor, with a switch turned off for second sensing block and a fourth sensing block of the Hall effect sensor; applying a biasing voltage between terminal of the first sensing block and third sensing block; and measuring a voltage drop over the second sensing block and the fourth sensing block.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to Hall effect sensors, methods of manufacture and modes of operation. More specifically, the present disclosure provides Hall effect sensors with four 3-contact vertical Hall elements (e.g., sensing blocks), with either fixed or switching/alternating connections. For example, the 3-contact sensing blocks can include a switching gate. Advantageously, by using the switching gate it is possible to eliminate unwanted voltage drop in a bias supply element to achieve maximum voltage sensitivity (>20%) and at the same time keep the structure symmetrical to achieve improved offset/residual voltage (>80%). As to the latter advantage, the 3-contact vertical Hall elements described herein eliminate unwanted voltage drop in a supply bias.

The sensing blocks and switching elements of the present disclosure can be manufactured in a number of ways using a number of different tools. In general, though, the methodologies and tools are used to form structures with dimensions in the micrometer and nanometer scale. The methodologies, i.e., technologies, employed to manufacture the sensing blocks and switching elements of the present disclosure have been adopted from integrated circuit (IC) technology. For example, the structures are built on wafers and are realized in films of material patterned by photolithographic processes on the top of a wafer. In particular, the fabrication of the sensing blocks and switching elements uses three basic building blocks: (i) deposition of thin films of material on a substrate, (ii) applying a patterned mask on top of the films by photolithographic imaging, and (iii) etching the films selectively to the mask.

Figure 1:
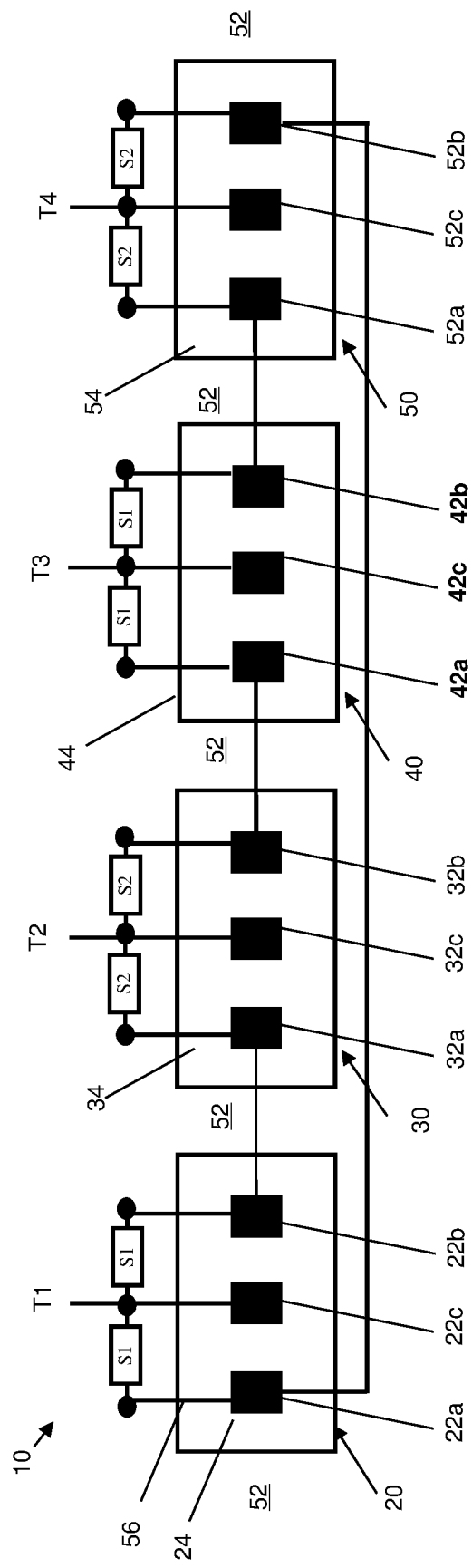
FIG. 1 shows a circuit diagram of a Hall effect sensor with switching elements in accordance with aspects of the present disclosure.

FIG. 1 shows a circuit diagram of vertical Hall effect sensor with switching elements in accordance with aspects of the present disclosure. More specifically, the circuit 10 includes a plurality of sensing blocks (Hall effect elements) 20, 30, 40, 50 in a sequential order. In embodiments, the sensing blocks 20, 30, 40, 50 each include three (3) contacts, e.g., contact pads. Specifically, the sensing block 20 includes contact pads 22a, 22b, 22c, the sensing block 30 includes contact pads 32a, 32b, 32c, the sensing block 40 includes contact pads 42a, 42b, 42c, and the sensing block 50 includes contact pads 52a, 52b, 52c. The contact pads in each of the sensing blocks 20, 30, 40, 50 are provided in a respective well 24, 34, 44, 54. In embodiments, the contact pads can be n+ contacts and the wells can be N-type wells. The wells 24, 34, 44, 54 can be fabricated using conventional ion implantation processes, as discussed in more detail herein.

Still referring to FIG. 1, each of the sensing blocks 20, 30, 40, 50 can be separated or isolated from one another by a deep trench isolation structure or a substrate material of different conductivity type, representatively shown at reference numeral 52. By way of example, the well 52 can be a P-type well when the respective wells 24, 34, 44, 54 are N-type wells; or vice versa. On the other hand, the deep trench isolation structure 52 can be an oxide, polysilicon or other insulative material fabricated using conventional lithography, etching and deposition methods as further described herein.

In further embodiments, each of the sensing blocks 20, 30, 40, 50 includes a switching element, e.g., transistor. For example, sensing blocks 20 and 40 include switching element S1; whereas, sensing blocks 30 and 50 include switching element S2. The switching element S1 can be a single switch and the switch S2 can be another single switch. The switching elements S1, S2 will permit current flow between the sensing blocks 20, 30, 40, 50 as described with respect to FIGS. 2A and 2B. For example, the switching elements S1, S2 provide current flow to the respective contacts in each of the respective sensing blocks 20, 30, 40, 50.

In FIG. 1, the switching elements S1, S2 and their respective contact pads can be connected together by wiring 56. By way of illustration, each respective sensing block 20, 30, 40, 50 is connected (e.g., coupled) together in series by wiring 56, at the respective contact pads, e.g., contact pad 22b to contact pad 32a, contact pad 32b to contact pad 42a, contact pad 42b to contact pad 52a, etc. The wiring 56 also connects the contacts pads to the respective switching elements S1, S2.

Figure 2A:
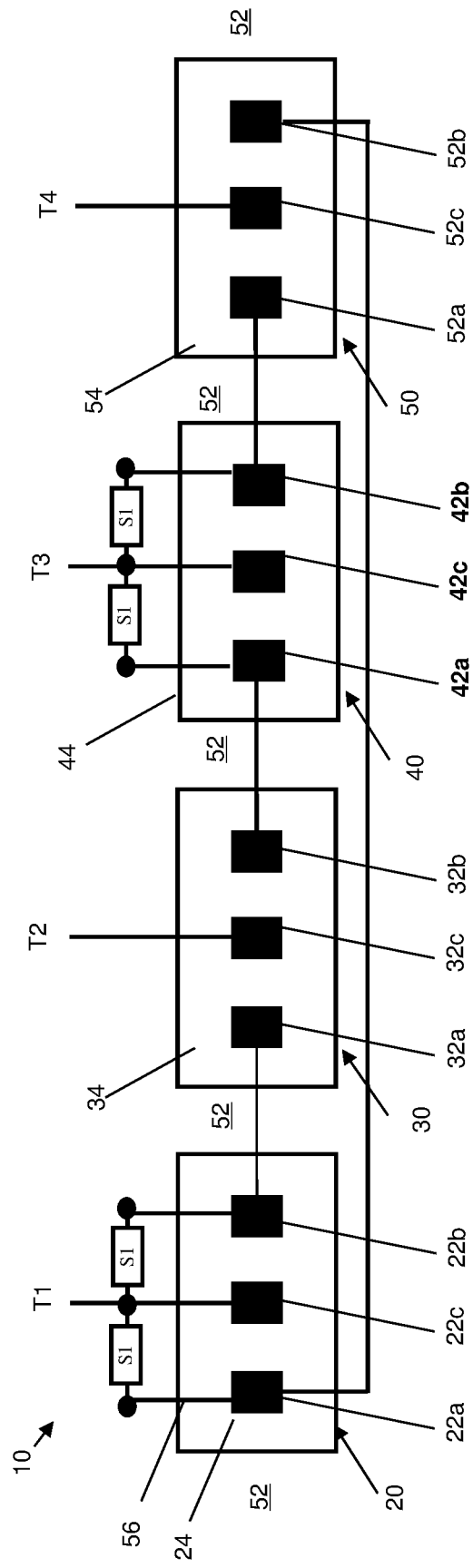
FIGS. 2A and 2B representatively show the different switching modes of the structure 10 of FIG. 1.
Figure 2B:
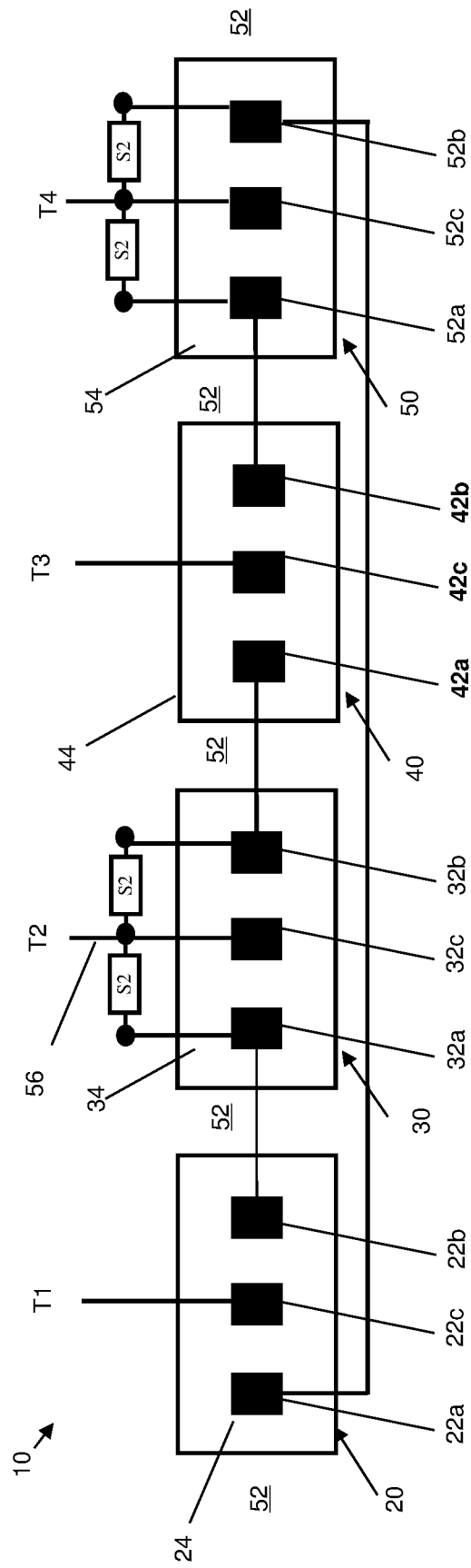

FIGS. 2A and 2B representatively show the different switching modes of the structure 10 of FIG. 1. By employing the switching elements, e.g., turning the switching elements S1, S2 on/off, a voltage drop on a bias supply element is eliminated and all voltage drop is in the sensing terminal to provide maximum voltage sensitivity. Also, at the same time, the symmetry of the structure is maintained (e.g., sensing blocks 20 to 40 in a first switching mode and sensing blocks 30 to 50 in a second switching mode).

By way of example and as representatively shown in FIG. 2A, a biasing voltage applied to terminals T1 and T3 is ground, as an example, switching element S1 is turned on and switching element S2 is turned off. In this way, a current will be forced from sensing block 20 to sensing block 40 and a voltage difference will be sensed between sensing blocks 30 and 50. This configuration will then provide maximum sensitivity in sensing block 30 and sensing block 50. On the other hand, as representatively shown in FIG. 2B, a biasing voltage is applied to terminals T2 or T4, switching element S2 is turned on and switching element S1 is turned off. In this way, a current will be forced from sensing block 30 to sensing block 50 or vice versa, and a voltage difference will be sensed between sensing blocks 20 and 40. This configuration will then provide maximum sensitivity in sensing block 20 and sensing block 40.

Figure 3A:
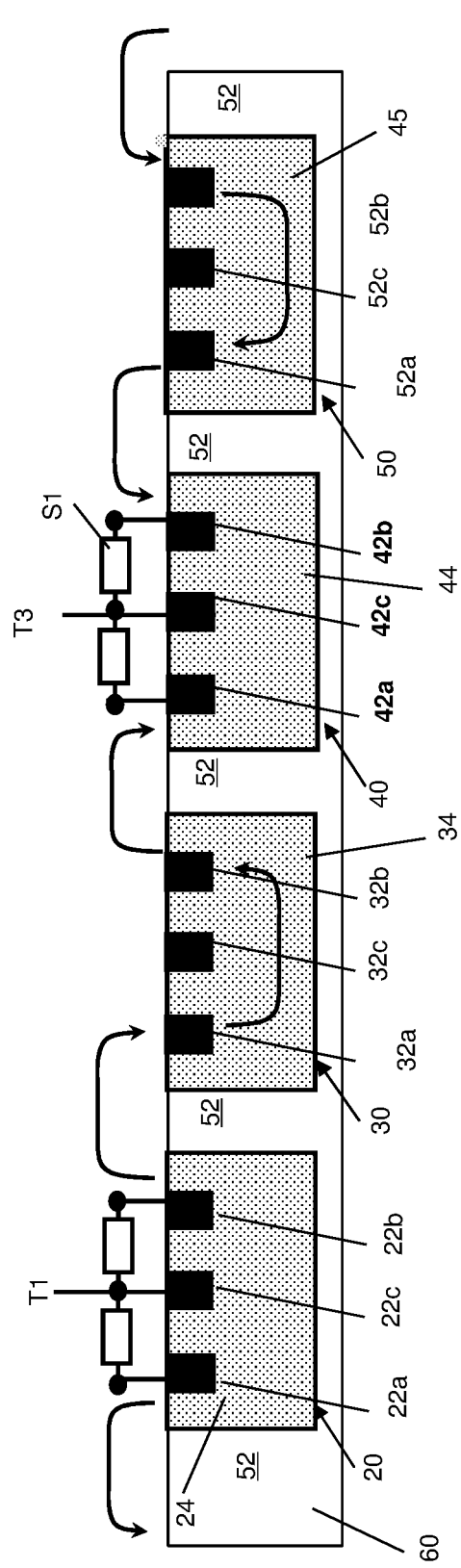
FIGS. 3A and 3B show cross-sectional views of the structure of FIG. 1 and respective switching modes of FIGS. 2A and 2B, and related fabrication processes in accordance with aspects of the present disclosure.
Figure 3B:
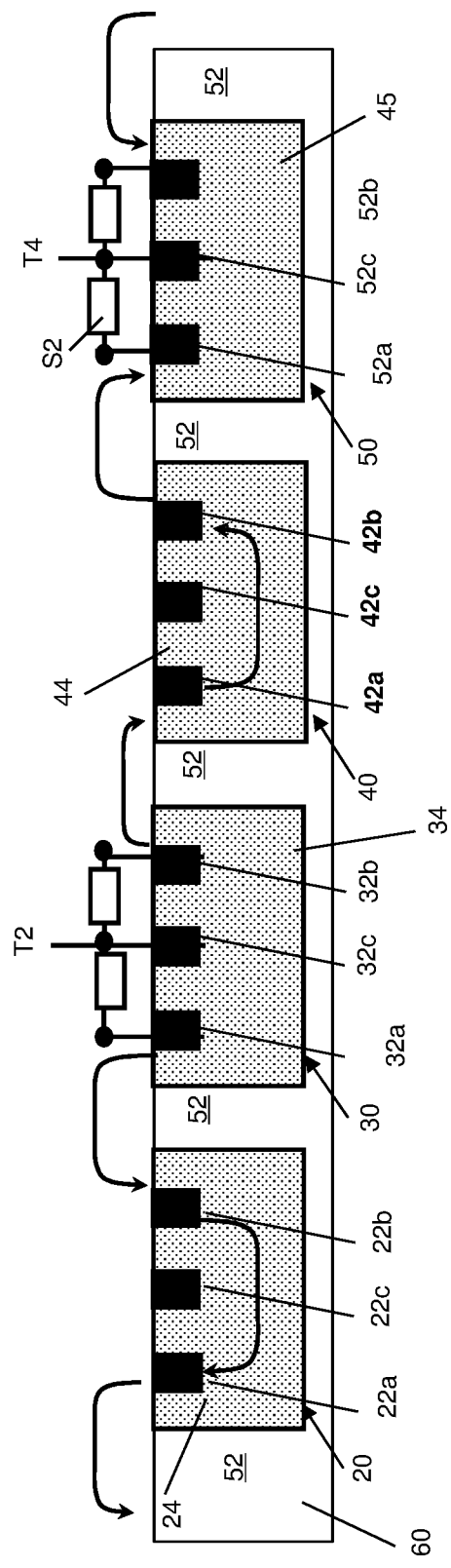

FIGS. 3A and 3B show cross-sectional views of the structure of FIG. 1 and respective switching modes of FIGS. 2A and 2B, and related fabrication processes in accordance with aspects of the present disclosure. The arrows in FIGS. 2A and 2B are representative of current flow during the respective switching modes as already described herein. In FIG. 3A, the switching element S2 is removed to representatively show that switching element S1 is turned on and switching element S2 is turned off; whereas, in FIG. 3B, the switching element S1 is removed to representatively show that switching element S2 is turned on and switching element S1 is turned off.

In the method of manufacturing the structure of FIG. 1, as representative shown in FIGS. 3A and 3B, the wells 24, 34, 44, 54 for each respective sensing block 20, 30, 40, 50 are formed in a substrate 60. The substrate 60 can be a P-type substrate. The wells 24, 34, 44, 54 can be fabricated using conventional ion implantation processes. For example, the wells 24, 34, 44, 54 may be formed by introducing a dopant by, for example, ion implantation in the substrate 60. The wells 24, 34, 44, 54 may be formed with an opposite conductivity type than the substrate 60.

In the manufacturing process, for example, an implantation mask may be used to define selected areas exposed for the implantation process. The implantation mask used to select the exposed areas, e.g., wells 24, 34, 44, 54, may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. An N-well is doped with n-type dopants, e.g., Arsenic (As), Phosphorus (P) and Sb; whereas, a P-well is doped with p-type dopants, e.g., Boron (B), among other suitable examples.

The contacts can be formed using a silicide process as an example. The contacts can also be formed using conventional lithography, etching and deposition methods known to those of skill in the art. As should be understood by those of skill in the art, the silicide process begins with deposition of a thin transition metal layer, e.g., nickel, cobalt or titanium, over ion implanted regions, e.g., wells 24, 34, 44, 54. After deposition of the material, the structure is heated allowing the transition metal to react with exposed silicon (or other semiconductor material as described herein) in the active regions of the semiconductor device (e.g., contact regions of the wells 24, 34, 44, 54) forming a low-resistance transition metal silicide. Following the reaction, any remaining transition metal is removed by chemical etching, leaving silicide contacts in the active regions (e.g., wells 24, 34, 44, 54). The wiring 56 can be connected to the contact pads and to a voltage source.

The isolation regions 52 can be either part of the substrate, e.g., doped material of an opposite conductivity type of the wells 24, 34, 44, 54 or a deep trench isolation structure. The deep trench isolation structures are formed by conventional lithography, etching and deposition methods known to those of skill in the art. For example, a resist formed over the substrate 60 is exposed to energy (light) to form a pattern (opening). An etching process with a selective chemistry, e.g., reactive ion etching (RIE), will be used to form one or more trenches in the substrate 60 through the openings of the resist. Following removal of the resist a conventional oxygen ashing process or other known stripants, insulator material can be deposited by any conventional deposition processes, e.g., chemical vapor deposition (CVD) processes. Any residual material can be removed by conventional chemical mechanical polishing (CMP) processes.

The wiring 56 can also be formed by conventional lithography, etching and deposition. Similar to that of the deep trench isolation structures, wiring 56 would be formed by a resist formed over an insulator material over the substrate 60, which is exposed to energy (light) to form a pattern (opening). An etching process with a selective chemistry, e.g., RIE, will be used to form one or more trenches in the insulator material to expose the contact pads. Following removal of the resist, conductive material can be deposited by any conventional deposition processes, e.g., (CVD) processes. Any residual material can be removed by conventional chemical mechanical polishing (CMP) processes.

The switching elements S1 and S2 can be conventional CMOS structures, e.g., transistors. The transistors can be fabricated using any conventional front end of the line processes. For example, the conventional CMOS processes can be conventional lithography, etching and deposition processes known to those of skill in the art used to fabricate switching devices, e.g., transistors. These processes include gate first or gate last (e.g., replacement gate) processes known to those of skill in the art such that no further explanation is required for a complete understanding of the present disclosure.

Figure 4:
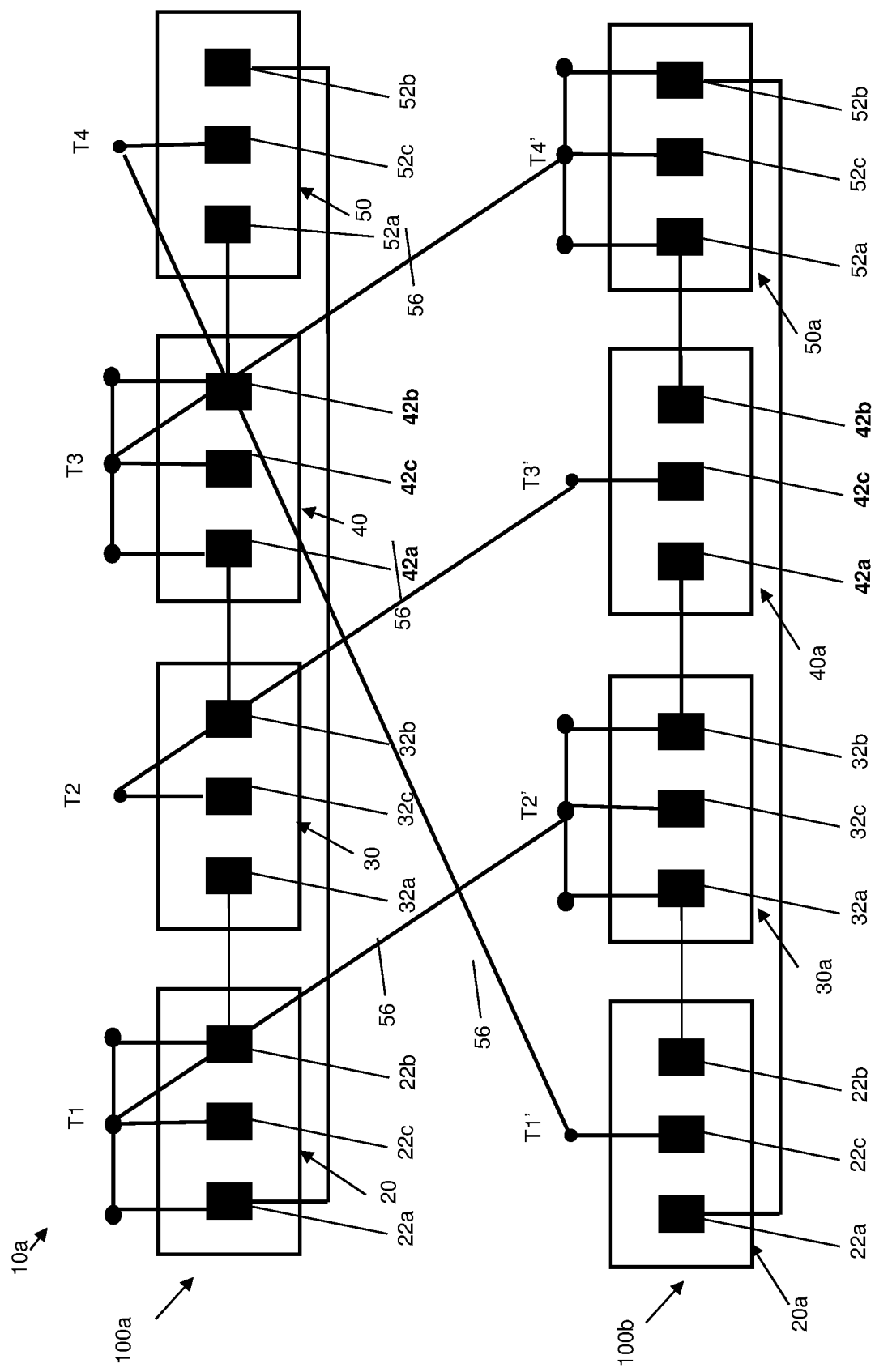
FIG. 4 shows a circuit diagram of a vertical Hall effect sensor with fixed connections in accordance with aspects of the present disclosure.

FIG. 4 shows a circuit diagram of a vertical Hall effect sensor with fixed connections between sensing blocks in accordance with aspects of the present disclosure. In this implementation, the circuit 10a includes two structures 100a, 100b each of which comprise four sensing blocks with three contacts as also shown in FIG. 1. In this configuration, the switching elements of FIG. 1 are omitted.

In the configuration shown in FIG. 4, in structure 100a, the contacts 22a, 22b and 22c of sensing block 20 are connected together by wiring 56. Similarly, in structure 100a, the contacts 42a, 42b and 42c of sensing block 40 are connected together by wiring 56. On the other hand, in structure 100a, the contacts 32a, 32b, 32c of sensing bock 30 and the contacts 52a, 52b, 52c of sensing bock 50 are not connected together by wiring. In contrast, in structure 100b, the contacts 22a, 22b and 22c of sensing block 20a and the contacts 42a, 42b and 42c of sensing block 40a are not connected together by wiring. In structure 100b, though, the contacts 32a, 32b and 32c of sensing block 30a and the contacts 52a, 52b and 52c of sensing block 50 are connected together by wiring 56.

In addition, the following fixed connections are provided by wiring 56:

(i) the sensing block 20 of structure 100a is directly connected to sensing block 30a of structure 100b;

(i) the sensing block 30 of structure 100a is directly connected to sensing block 40a of structure 100b;

(i) the sensing block 40 of structure 100a is directly connected to sensing block 50a of structure 100b; and (i) the sensing block 50 of structure 100a is directly connected to sensing block 20a of structure 100b.

In operation using the fixed connections, a current can be forced from sensing block 20 to sensing block 40 for the upper device 100a to measure a voltage difference between the sensing element 30/40a and sensing element 50/20a. Note that terminals 30 and 40a are the same terminal in this case, because they are connected electrically together. Similarly, 50 and 20a are the same terminal when they are connected electrically together. In this way the sensing blocks of each structure 100a, 100b are connected together to form a symmetrical structure for higher sensitivity with offset voltage cancelled directly, and without using the switching elements.

The 3-contact vertical Hall elements can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a plurality of sensing blocks each of which include a plurality of contacts;
    a first switching element coupled to a first set of sensing blocks of the plurality of sensing blocks; and
    a second switching element connecting to a second set of sensing blocks of the plurality of sensing blocks, wherein
    the first switching element is connected to alternating sensing blocks of the plurality of sensing blocks and the second switching element is connected to another set of alternating sensing blocks of the plurality of sensing blocks, and
    the first switching element is connected to a first sensing block and a third sensing block, and the second switching element is connected to a second sensing block and a fourth sensing block, and the first through fourth sensing blocks are in a sequential order.

2. The structure of claim 1, wherein the plurality of sensing blocks are four sensing blocks each comprising three contacts.

3. The structure of claim 2, wherein one of the contacts within each sensing block is connected to a biasing voltage.

4. The structure of claim 2, wherein each of the sensing blocks are connected to another by wiring, in series.

5. The structure of claim 1, wherein each of the sensing blocks includes wells that are isolated from one another.

6. The structure of claim 1, wherein the first switching element is different from the second switching element.

7. The structure of claim 1, wherein:
    when the first switching element is turned on and the second switching element is turned off, a current is forced from the first sensing block to the third sensing block or from the third sensing block to the first sensing block, a voltage difference is sensed between the second sensing block and the fourth sensing block.

8. The structure of claim 1, wherein, when the second switching element is turned on and the first switching element is turned off, a current will be forced from the second sensing block to the fourth sensing block or a current will be forced from the fourth sensing block to the second sensing block, and a voltage difference is sensed between the first sensing block and the third sensing block.

9. A structure comprising:
a first plurality of sensing blocks each of which include a plurality of contacts;
a second plurality of sensing blocks each of which include a plurality of contacts; and
a fixed connection between the first plurality of sensing blocks and the second plurality of sensing blocks, wherein
the plurality of contacts include three contacts provided for each sensing block of the first plurality of sensing blocks and the second plurality of sensing blocks,
in the first plurality of sensing blocks, the plurality of contacts in a first set of alternating sensing blocks are connected together, and the plurality of contacts in a second set of alternating sensing blocks are not connected together, and
in the second plurality of sensing blocks, the plurality of contacts in a first set of alternating sensing blocks are not connected together, and the plurality of contacts in a second set of alternating blocks are connected together.

10. The structure of claim 9, wherein the first plurality of sensing blocks are four sensing blocks and the second plurality of sensing blocks are four sensing blocks.

11. The structure of claim 9, wherein:
the first set of alternating sensing blocks of the first plurality of sensing blocks and the first set of alternating sensing blocks of the second plurality of sensing blocks are first and third sensing blocks, respectively; and
the second set of alternating sensing blocks of the first plurality of sensing blocks and the second first set of alternating sensing blocks of the second plurality of sensing blocks are second and fourth sensing blocks, respectively.

12. The structure of claim 11, wherein:
the first sensing block of the first plurality of sensing blocks is connected to the second sensing block of the second plurality of sensing blocks;
the second sensing block of the first plurality of sensing blocks is connected to the third sensing block of the second plurality of sensing blocks;
the third sensing block of the first plurality of sensing blocks is connected to the fourth sensing block of the second plurality of sensing blocks; and
the fourth sensing block of the first plurality of sensing blocks is connected to the first sensing block of the second plurality of sensing blocks.

13. The structure of claim 12, wherein:
the first plurality of sensing blocks are connected together in series; and
the second plurality of sensing blocks are connected together in series.

14. The structure of claim 10, wherein each of the sensing blocks of the first plurality of sensing blocks and the second plurality of sensing blocks includes wells that are isolated from one another.

15. The structure of claim 14, wherein the wells are isolated from one another by a substrate material that is a different conductivity type than the wells.

16. A method comprising:
turning on a switch for a first sensing block and a third sensing block of a Hall effect sensor, with a switch turned off for a second sensing block and a fourth sensing block of the Hall effect sensor;
applying a biasing ground voltage to a terminal of the first sensing block and the third sensing block such that a current will be forced from the first sensing block to the third sensing block;
sensing a voltage difference between the second sensing block and the fourth sensing block; and
applying a biasing voltage to a terminal of the second switching block and the fourth switching block, such that the switch of the second block is turned on and the switch for the third block is turned off, a current is forced between the second sensing block and the fourth sensing block and a voltage difference is sensed between the first sensing block and the fourth sensing block.

* * * * *